United States Patent [19]

Hewlett, Jr.

[11] 4,104,732

[45] Aug. 1, 1978

[54] STATIC RAM CELL

[75] Inventor: Frank Wilson Hewlett, Jr., Dallas, Tex.

[73] Assignee: Texas Instruments Incorporated, Dallas, Tex.

[21] Appl. No.: 821,068

[22] Filed: Aug. 2, 1977

[51] Int. Cl.² ............................................. G11C 11/40
[52] U.S. Cl. .................................... 365/179; 365/175; 307/290; 307/317 A
[58] Field of Search ............ 307/238, 279, 290, 317 A

[56] References Cited

U.S. PATENT DOCUMENTS 3,427,598   2/1969   Kubinec ......................... 340/173 PE

OTHER PUBLICATIONS

IBM Tech. Dis. Bull., vol. 15, No. 1, Jun. 1972, p. 260, "Double Emitter-Bit Line Schottky Memory Cell", by Siplatt.

Primary Examiner—Terrell W. Fears
Attorney, Agent, or Firm—James T. Comfort; Gary C. Honeycutt

[57] ABSTRACT

A static RAM cell, including two vertical, multiple-Schottky-collector switching transistors wherein a first collector of each is coupled to first and second sources of read/write data, respectively, and wherein a second collector of each transistor is cross-coupled with the base of the other transistor. The cell is implemented with I²L technology, and also includes a complementary inverted multiple-collector NPN load transistor having its base electrically common with the emitters of the switching transistors, a first collector merged with the base of one switching transistor, and a second collector merged with the base of the other switching transistor.

4 Claims, 3 Drawing Figures

STATIC RAM CELL

This invention relates to memory circuits, and more particularly, to a microelectronic integrated memory cell of a static RAM type, implemented with integrated injection logic ($I^2L$) technology.

Many static random access memory cells have been proposed and/or implemented using bipolar transistor technology. Recently, attention has been directed to the design of high density static bipolar memory cells using $I^2L$ technology. For example, S. K. Wiedmann has proposed an "Injection-Coupled Memory" cell in the IEEE Journal of Solid State Circuits, Vol. SC-8, No. 5, October 1973, pp. 332-337. The injection-coupled cell uses the principle of direct carrier injection to provide a compact cell structure wherein lateral pnp load and sense transistors are combined with inversely operated npn flip-flop transistors. Upon read selection of a bit, the select current appears in the sense lines diminished by the product of load and sense lateral pnp alphas.

The read operation requires two relatively long lateral pnp transit time delays and on-chip, internally generated clock timing. The write operation requires one lateral pnp and one npn transit time delay.

Accordingly, it is an object of the present invention to provide a high density static bipolar RAM cell having enhanced read select currents, and reduced transit-time delays, without the complication of internally generated clock timing, thereby permitting lower power consumption.

One aspect of the invention is embodied in a storage cell comprising first and second multiple-Schottky-collector (PNM) switching transistors wherein a first collector of each is coupled to first and second sources of read/write data, respectively, and wherein a second collector of each transistor is cross-coupled with the base of the other transistor.

In a more specific embodiment, the cell further includes a complementary multiple-collector NPN load transistor having its base electrically common with the emitters of said switching transistors, having a first collector merged with the base of said first switching transistor, and having a second collector merged with the base of said second switching transistor.

Figure 1:
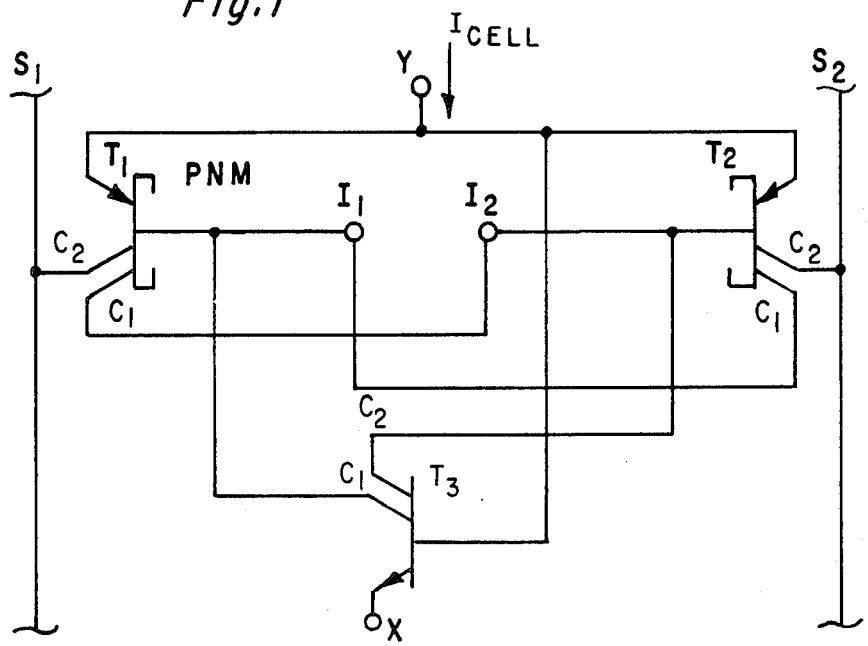
FIG. 1 is a schematic diagram of the equivalent circuit of the device of the invention.

As shown in FIG. 1, the RAM cell of the invention includes a first inverted multiple-collector (Schottky) transistor $T_1$ cross-coupled with a second multiple-collector (Schottky) transistor $T_2$. The emitters of $T_1$ and $T_2$ are electrically common with each other, and with the base of complementary multiple-collector load transistor $T_3$. The base of $T_1$ and of $T_2$ is merged with collectors $C_1$ and $C_2$, respectively, of $T_3$.

When $T_1$ is "on" a portion of the cell current passes through its emitter-base junction and then through the load transistor (collector $C_1$) to ground. Part of the cell current passes directly to the base of $T_3$. The remaining cell current is available in $C_1$ and $C_2$ to feed $C_2$ of $T_3$, holding $T_2$ in the "off" state and to charge source line $S_1$, respectively.

Writing is performed by raising the voltage level in a selected source line $S_1$, for example, which causes $T_1$ collector $C_2$ to saturate, thereby robbing base drive from collector $C_1$. As a result, $C_1$ current drops, allowing $T_2$ to turn "on" which holds $T_1$ "off", thereby changing the binary state of the cell.

Current robbing is a very effective "write" mechanism in the cell, due to the negligible down-current gain in the PNM transistor. Schottky collector $C_2$ is a majority carrier device having a low (0.003) minority carrier injection efficiency.

The cell size (e.g., 3.79 $mil^2$) is 18% smaller than the injection-coupled cell, using known design rules for $I^2L$ devices. The emitter of the load transistor, $T_3$, is formed by N+ diffusion under the epitaxial layer. The NPN intrinsic base is formed by ion implanted boron and is merged with the emitters of $T_1$ and $T_2$. This commonality is a key to small cell size. Further, the vertical active transistor characteristics are dependent solely upon well-controlled ion implantations, not upon photolithography, resulting in a fast, high-yield device, amenable to additional increases in cell density.

Figure 3:
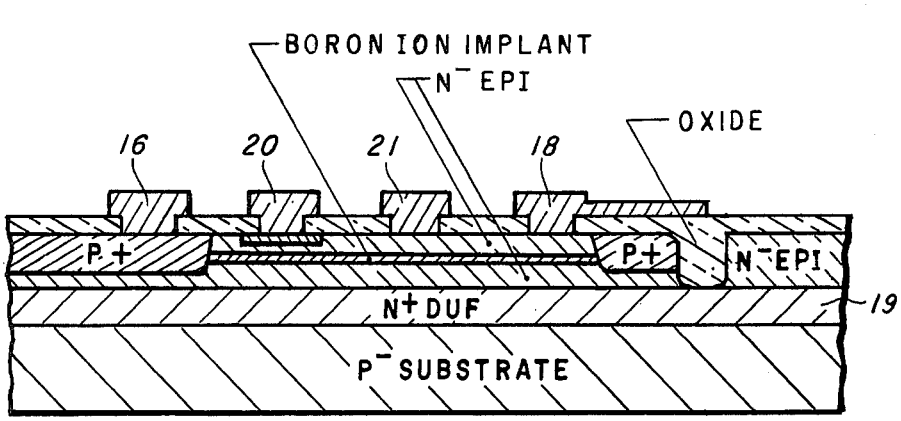
FIG. 3 is a cross-section of the circuit of FIG. 2, illustrating one embodiment for fabricating the device of the invention.
Figure 2:
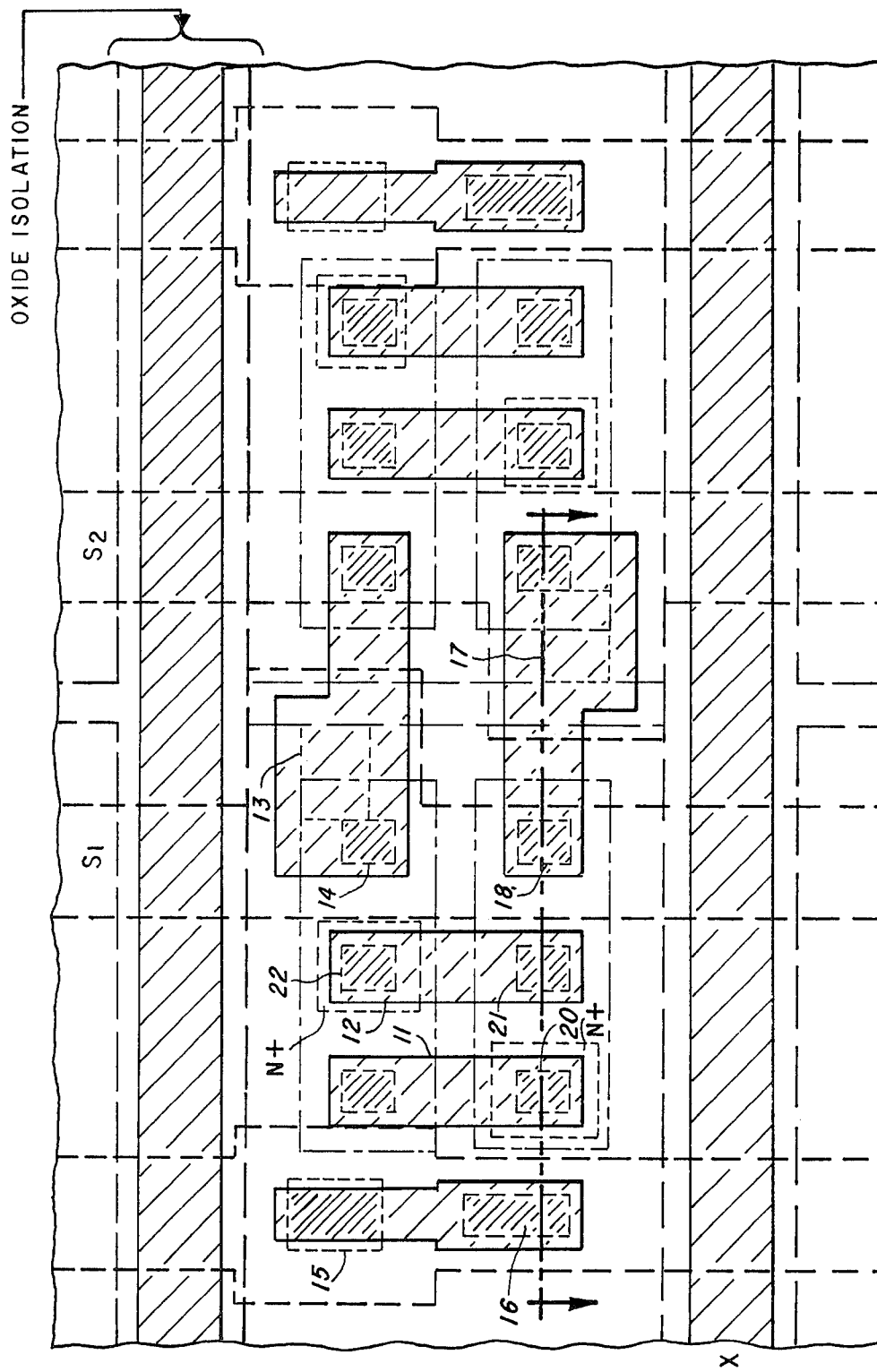
FIG. 2 is a greatly enlarged, fragmentary top view of an integrate circuit illustrating the layout of a single cell of a multiple-cell array.

As shown in FIGS. 2 and 3, the memory cell of the invention is readily integrated using $I^2L$ technology. Metallization strips 11 and 12 are cross-coupling between the bases and collectors of $T_1$ and $T_2$, respectively, while line $S_1$ connects collector $C_2$ of $T_1$ through via 13 and contact 14. Line Y connects the emitters of both $T_1$ and $T_2$ through via 15 and contact 16. Line $S_2$ connects collector $C_2$ of $T_2$ through via 17 and contact 18. Line X contacts N+ DUF zone 19 which is the emitter of the load transistor (Not shown in FIG. 2). Ohmic contact 20 is to the base of $T_2$, while Schottky contact 21 forms collector $C_1$ of $T_2$.

What is claimed is:

1. A storage cell comprising first and second multiple-Schottky-collector switching transistors wherein a first collector of each is coupled to first and second sources of read/write data, respectively, and wherein a second collector of each transistor is cross-coupled with the base of the other transistor.

2. A cell as in claim 1 further including a complementary multiple-collector load transistor having its base electrically common with the emiters of said switching transistors, having a first collector coupled to the base of said first switching transistor, and having a second collector coupled to the base of said second switching transistor.

3. A storage cell as in claim 1 wherein said load transistors are integrated in a monocrystalline silicon body comprising a n-type epitaxial layer of high resistivity covering an n-type region of low resistivity, said latter region being common to the emitter of each of said transistors.

4. A storage cell as in claim 3 further including a complementary multiple-collector load transistor having its base electrically common with the emitters of said switching transistors, having a first collector merged with the base of said first switching transistor, and having a second collector merged with the base of said second switching transistor.

* * * * *

UNITED STATES PATENT AND TRADEMARK OFFICE
CERTIFICATE OF CORRECTION

PATENT NO. : 4,104,732
DATED : August 1, 1978
INVENTOR(S) : Frank W. Hewlett, Jr.

It is certified that error appears in the above-identified patent and that said Letters Patent are hereby corrected as shown below:

Claim 3, line 1 "A storage cell as in Claim 1" has been deleted and replaced with --A plurality of storage cells as in Claim 2--.

Signed and Sealed this

Thirteenth Day of October 1981

[SEAL]

Attest:

GERALD J. MOSSINGHOFF

Attesting Officer

Commissioner of Patents and Trademarks